(12) United States Patent
Crewson et al.

(10) Patent No.: US 7,885,049 B2
(45) Date of Patent: Feb. 8, 2011

(54) ELECTRICAL POWER SWITCHING WITH EFFICIENT SWITCH PROTECTION

(75) Inventors: Walter Crewson, Ridgefield, CT (US); Mark H. Kaltenborn, Ridgefield, CT (US)

(73) Assignee: Scandinova Systems AB, Uppsala (SE)

( * ) Notice: Subject to any disclaimer, the term of this patent is extended or adjusted under 35 U.S.C. 154(b) by 488 days.

(21) Appl. No.: 11/628,855

(22) PCT Filed: Jun. 29, 2005

(86) PCT No.: PCT/SE2005/001040

§ 371 (c)(1),
(2), (4) Date: Mar. 3, 2008

(87) PCT Pub. No.: WO2006/004512

PCT Pub. Date: Jan. 12, 2006

(65) Prior Publication Data

US 2008/0253052 A1    Oct. 16, 2008

(30) Foreign Application Priority Data

Jul. 2, 2004    (SE) .................................... 0401780

(51) Int. Cl.
*H02H 3/16* (2006.01)
(52) U.S. Cl. ..................................................... 361/98
(58) Field of Classification Search ............... 361/93.5, 361/93.6, 98, 42; 307/106; 372/83.03
See application file for complete search history.

(56) References Cited

U.S. PATENT DOCUMENTS

| | | | |
|---|---|---|---|
| 3,273,075 A | 9/1966 | Kennedy | 331/87 |
| 3,737,679 A | 6/1973 | Cooper | 307/252 |
| 4,052,751 A * | 10/1977 | Shepard | 361/50 |
| 4,160,214 A | 7/1979 | Colin et al. | 328/65 |
| 4,612,477 A | 9/1986 | Dothan | |

(Continued)

FOREIGN PATENT DOCUMENTS

JP    60-157200    8/1985

(Continued)

OTHER PUBLICATIONS

Translation of official action, May 22, 2008, in corresponding Russian Application No. 2006146878/09(051190), along with the accepted claims.

(Continued)

*Primary Examiner*—Jared J Fureman
*Assistant Examiner*—Angela Brooks
(74) *Attorney, Agent, or Firm*—Nixon & Vanderhye P.C.

(57) ABSTRACT

A transmission delay line is introduced between the switch and the power output side of a power switching system so that sparking of the load is hidden from the switch by the time delay of the transmission line. This makes it possible to detect the load spark and actively protect the switch, typically by turning the switch off, before it actually knows that there has been a load fault spark. Alternatively, the delay of the transmission line is long enough so that the switch has already been turned off in normal pulse operation before the load fault current reaches the switch. Either way, the switch will be turned off under normal current flow and will not be subject to destructive over-current or over-voltage conditions.

35 Claims, 9 Drawing Sheets

U.S. PATENT DOCUMENTS

| | | | |
|---|---|---|---|
| 4,614,878 A | 9/1986 | Launcher et al. | 307/106 |
| 5,452,174 A | 9/1995 | Akutsu et al. | |
| 5,892,352 A | 4/1999 | Kolar et al. | 323/213 |
| 5,905,646 A * | 5/1999 | Crewson et al. | 363/132 |
| 6,741,484 B2 | 5/2004 | Crewson et al. | 363/72 |
| 2002/0135344 A1* | 9/2002 | Tamai et al. | 323/283 |
| 2003/0086218 A1 | 5/2003 | Folliot et al. | |

FOREIGN PATENT DOCUMENTS

| | | |
|---|---|---|
| JP | 07-015865 | 1/1995 |
| JP | 2004-226185 | 8/2004 |
| WO | WO 98/28845 | 7/1998 |
| WO | WO 03/061125 | 7/2003 |

OTHER PUBLICATIONS

G.N. Glascoe and J.V. Lebacqz, "Pulse Generators", M.I.T. Radiation Laboratory Series on Radar, vol. 5, 1948, pp. 156-172.

International Search Report of PCT/SE2005/001040, mailed Oct. 14, 2005.

Translation of Japanese official action, Mar. 10, 2010, in corresponding Japanese Application No. P2007-519166.

* cited by examiner

ELECTRICAL POWER SWITCHING WITH EFFICIENT SWITCH PROTECTION

This application is the US national phase of international application PCT/SE2005/001040, filed 29 Jun. 2005, which designated the U.S. and claims priority of SE 0401780-2, filed 2 Jul. 2004, the entire contents of each of which are hereby incorporated by reference.

TECHNICAL FIELD

The technology generally relates to electrical power systems such as power generators, power modulators and the like, and more particularly to the issue of power switching in such systems and protection of the switches.

BACKGROUND

Electrical power systems can be found in virtually all industrial areas, and they normally involve some form of power switching equipment for controllably transferring electrical power or energy to the intended load. Electrical power switching is used in a wide variety of applications such as locomotive traction, automobiles, conveyor systems, escalators and elevators, air conditioning equipment, appliances, microwave systems, medical equipment, laser drivers and radar applications.

A particular example of a commonly used power system is a power modulator, which can be regarded as a device that controls the flow of electrical power. When a power modulator is designed for generating electrical pulses it is also referred to as a pulse modulator or pulse generator. In its most common form, a power modulator delivers a train of high power electrical pulses to a specialized load. By way of example, high power electrical pulses are utilized for powering microwave amplifier tubes in driving electron accelerator systems and/or microwave generating systems for applications such as medical radiation applications and radar applications. Most of the world's high power radar sets use modulators to deliver power pulses to a microwave source, which, in turn, feeds the power, in the form of periodic bursts of microwaves, to an antenna structure. Of course, many other applications also exist. The quality requirements on the generated pulses may be high. Pulse energy, pulse width, rise time, fall time and pulse flatness are some of the quality parameters usually under consideration.

In the decades since World War II, the basic structure of power modulators has not changed significantly. A traditional power modulator consists of a power supply, which receives power from an AC power line, steps up the voltage, rectifies the power to produce direct current (DC) power, and is used to deliver energy to a reservoir, usually formed by an energetic capacitor bank. This is necessary because the input power line cannot deliver the peak power that is normally required, so the reservoir is used to deliver the peak power in small bites of energy, and is replenished or refilled by the DC power supply at a reasonably constant rate with much lower average power. Part of the energy in this reservoir is then transferred to a second smaller reservoir, usually a so-called pulse-forming network (PFN), which is normally based on several interconnected inductors and capacitors.

The PFN is rapidly charged to for example 20 kV and then momentarily connected to a pulse transformer by a high-voltage switch to deliver half the charging voltage to the pulse transformer. The high-voltage switch is typically a plasma or ionized-gas switch such as a hydrogen thyratron tube that can only be turned on but not turned off. Instead, the PFN is required to create the pulse and deliver power to the load in the form of a rectangular pulse with a relatively fast rise and fall-time as compared to the pulse width. The PFN discharges in a traveling-wave manner, with an electrical pulse wave traveling from the switched end to the "open circuited" end, reflecting from this open circuit and returning toward the switched end, extracting energy from the energy storage capacitors as it travels and feeding the energy into the pulse transformer. The pulse ends when the traveling wave has traversed the PFN structure in both directions and all the stored energy has been extracted from the network. The PFN voltage before switching is V, and the voltage applied to the primary side of the pulse transformer is V/2 or a bit less.

If a component in the PFN fails, it is necessary to re-tune the PFN for optimal pulse shape after the component is replaced. This is laborious and dangerous work, as it must be done with high voltage applied to the PFN. Besides, if a different pulse width is needed, it is necessary to replace and/or re-tune the entire PFN structure.

Having delivered the pulse, the PFN must be recharged completely to voltage V for the next pulse. To maintain a pulse-to-pulse repeatability of a few tenths of one percent, this large charging voltage "swing" must occur with great precision. Also, fully charging and fully discharging all the PFN capacitors for each pulse, several hundred to several thousand times per second, puts a heavy strain on the dielectric material in these capacitors, and this forces the capacitors to be designed with very low stress and hence a very low energy density. This makes the PFN a quite large structure.

All conventional power modulators that are based on high-voltage PFN switches, such as a thyratron or silicon-controlled rectifier switch, have a problem if a short circuit occurs at the load (as happens frequently with magnetron tubes for example). These modulators can not be turned off during the pulse, and very large fault currents can develop that sometimes damage both the modulator (particularly the switches) and the load. There is no way to interrupt the flow of current, as the high voltage PFN switch can not be turned off until the current falls to zero.

For the interested reader, general information on conventional pulse generators can be found in Vol. 5 of the M.I.T. Radiation laboratory Series on Radar: "Pulse Generators", edited by Glasoe and LeBacqz, Wiley, N.Y. (from the late 1940's).

U.S. Pat. No. 5,905,646 relates to a novel power modulator concept using one or more switches 20 that is/are electronically controllable at both turn-on and turn-off to more or less directly connect the power source 10 to a pulse transformer 30 and/or load 40, as schematically illustrated in FIG. 1. The power source 10 is normally based on one or more energy storage capacitors that are charged by a DC power supply. The pulse width is electronically controlled by a control circuit 22 that triggers the switch to turn-on to start the pulse and to turn-off to terminate the pulse. To ensure sufficient pulse flatness, a specialized circuit can be utilized to compensate for a voltage droop during capacitor discharge. This novel type of modulator, which is sometimes referred to as the LCW modulator after the inventors Lindholm, Crewson and Woodburn, provides several advantages over the traditional PFN-based modulators:

The need for PFN networks is eliminated;

More compact constructions can be obtained;

Smaller stray losses;

Longer expected lifetime;

The pulse width can be adjusted electronically. No circuit changes or re-adjustments are needed. In the limit, the pulse width can even be changed from pulse to pulse if this should ever be needed.

The voltage delivered to the load is the same as the capacitor voltage, not half as with PFN-based modulators. This means that the full rated power of the switch can be used rather than half the power (full voltage and current).

FIG. 2 is a schematic circuit diagram of an exemplary LCW type modulator according to the prior art. The power source 10 is basically a DC power supply that charges an energy storage capacitor. An electronically on-off controllable switch 20, such as an IGBT (Insulated-Gate Bipolar Transistor) switch, connects the capacitor to the primary side of a step-up pulse transformer 30 via a passive pulse flattening network.

Although the LCW modulator constitutes a significant advance in modulator technology, there is a price for the above advantages. The simple and more or less direct connection between the charged capacitor(s) and the load exposes the switch to possibly destructive currents and voltages if there is a load fault such as a short-circuit.

Some modern solid-state switches such as IGBT (Insulated-Gate Bipolar Transistor) switches have a built-in protection against short-circuits. However, interrupting high currents generally shortens the lifetime of IGBTs in an unpredictable way. Although some IGBTs, with a DC current rating of 1600 amps, have a "10×" short-circuit current rating, meaning that they should be able to interrupt up to 10 times the rated DC current or 16,000 amps in about ten microseconds, this is actually a "once in a lifetime" event for the switch, and is generally not meant to be repeated.

Consequently, there is a general need to protect the switches from load faults such as short-circuit faults to prevent the switch from being destroyed and/or to preserve its lifetime.

SUMMARY

The technology described herein overcomes these and other drawbacks of the prior art arrangements.

It is a general object to protect the switch(es) in a power-switching system of an electrical power system from load faults and the like.

In particular it is desirable to protect the switch(es) from load short-circuits.

It is also an object to protect the switch(es) from an open-circuit load fault.

It is a specific object to retain the advantages of modern power modulator circuits based on electronically on-off controllable switches while eliminating the problem of destructive load fault currents and/or voltage spikes.

It is a particular object to provide an improved electrical power switching system.

It is another particular object to provide an improved electrical power system.

A transmission delay line is introduced between the switch and the power output side of the power switching system so that any sparking of the load is hidden from the switch by the time delay of the transmission line. This makes it possible to detect the load spark and actively protect the switch, typically by turning the switch off, before it actually knows that there has been a load fault spark. Alternatively, the delay of the transmission line is long enough so that the switch has already been turned off in normal pulse operation before the load fault current reaches the switch. Either way, the switch will be turned off under normal current flow and will not be subject to destructive over-current or over-voltage conditions.

Basically, an electrical power switching system according to the invention preferably comprises a power input side and a power output side, a switch for switching an energy pulse from the power input side to the power output side, and a transmission line, connected between the switch and the power output side, for transmitting the energy pulse with a delay to enable protection of the switch from a load fault current.

In order to be able to reduce the delay and hence the physical size of the transmission line, it is highly beneficial to detect the load fault current, and actively protect the switch, preferably by immediately turning the switch off, before the over-current reaches the switch.

The switching is preferably accomplished by electronically controlled turn-on and turn-off of the switch so that the switch is turned-on to start the pulse and turned-off to terminate the pulse. Most electronically on-off controllable switches, such as modern solid-state switches have a so-called storage time which corresponds to a time delay between the application of the turn-off signal and the response of the switch to start turning off the current. This time delay is often referred to as the turn-off delay of the switch. Therefore, unless extremely short pulses are produced, the transmission line is preferably configured with a delay larger than the turn-off delay of the switch so that there will be sufficient time to really turn the switch off.

As an optional security measure, just to be on the safe side, the delay of the transmission line is typically larger than sum of the switch turn-off delay and the current fall-time so that the current can be fully "off" before the news of the fault reaches the switch.

To avoid interfering with the pulse shape, the transmission line preferably has a delay larger than half the pulse width. In this way, reflections caused by the transmission line will never occur during the pulse.

Advantageously, the transmission line is an inductor-capacitor (LC) based transmission line, which looks a lot like a traditional PFN network, but which has an entirely different function. The transmission line is not used for storing the pulse energy as the PFN, but is merely a delay line to transmit the pulse energy with more or less the same voltage on the output side as on the input side. The PFN output voltage is merely half the input voltage, and requires a traveling wave to extract the capacitor energy.

As an additional optional security measure, a de-spiking diode may be connected, on the input side of the transmission line, in parallel with a capacitor of the inductor-capacitor based transmission line.

The transmission delay line may be implemented in other ways, for example based on a number of saturating cores.

In accordance with an exemplary embodiment, the transmission line may in fact be designed as a non-uniform transmission line to customize the pulse form. For example, the impedance on the output side of the transmission delay line may be different from the impedance on the input side of the transmission delay line to thereby achieve a tapering of the impedance over the delay line. If the impedance on the output side of the transmission delay line is lower than the impedance on the input side of the transmission delay line it is for example possible to compensate for a voltage-droop during discharge of a capacitor-based power source and maintain a pulse flatness better than 1 percent of the mean pulse amplitude. By way of example, the tapering of the impedance may be achieved by inserting a conducting rod that has a tapered cross-section into the delay line coil.

Typically, the impedance of the transmission line is matched to the load with which the power switching system is intended to be used so that the pulse energy goes into the load and does not bounce back to the pulse generating module.

There is not only the problem of short-circuits at the load, but there may also be a problem with an open-circuit load fault. For this reason, the power switching system of the invention preferably comprises a voltage clamping circuit, such as a metal-oxide varistor, provided on the output side of the transmission line to enable protection against an open-circuit load fault.

The technology described herein is applicable to all switched power systems in which the switches have to be protected against load fault currents. The overall power system, such as a power modulator for generating pulsed output power, for example comprises a voltage step-up transformer provided between the transmission line and the power output side. The transformer may for example be a split-core transformer in a circuit configuration corresponding to U.S. Pat. No. 5,905,646 or U.S. Pat. No. 6,741,484.

The technology described herein offers the following advantages:

Efficient switch protection based on transmission delay;
High power output. A power system of the invention can surprisingly deliver up to four (4!) times the power compared to a corresponding conventional power system without the delay-based switch protection;
Protection against short-circuit load faults;
Detection of load fault current and active turn-off of the switch to reduce the delay and hence the physical size of the transmission line;
Transmission delay line with integrated voltage-droop compensation;
Protection against open-circuit load faults.

Other advantages will be appreciated when reading the below description.

DETAILED DESCRIPTION

Figure 1:
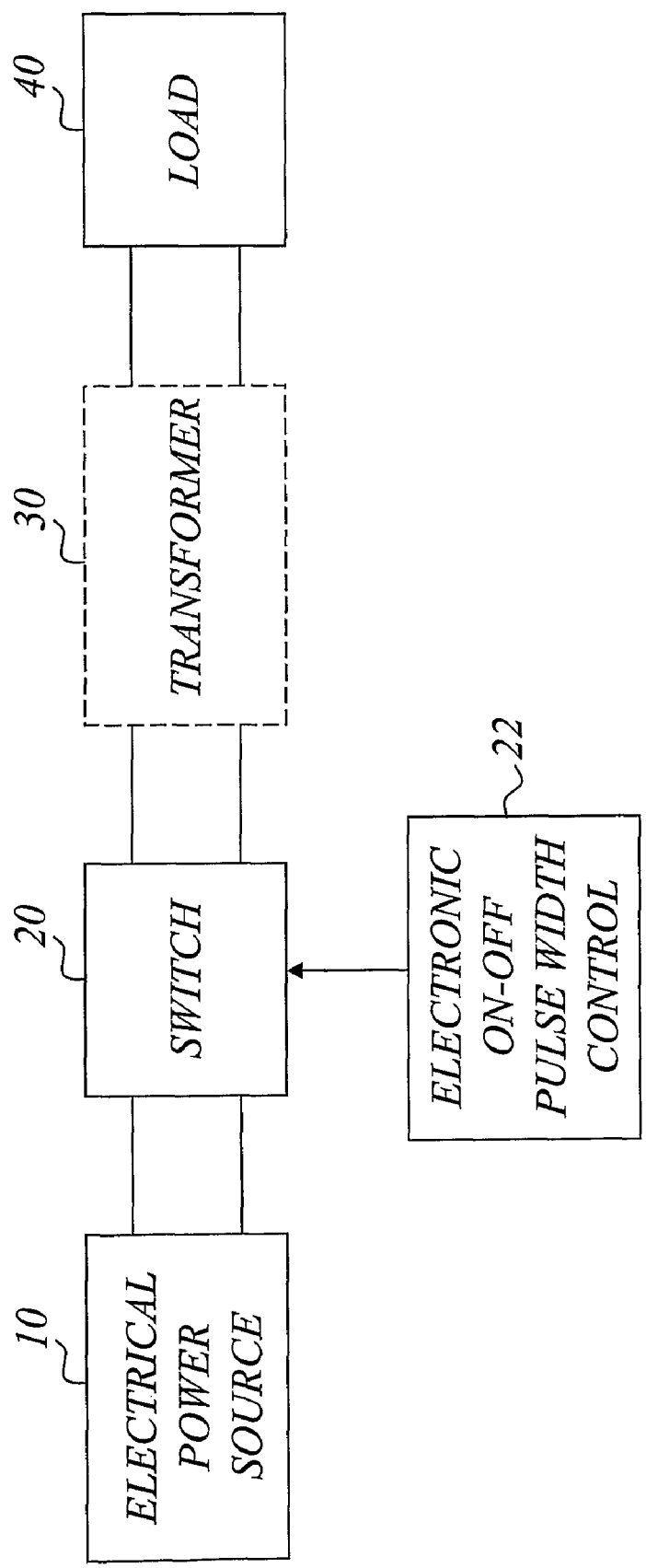
FIG. 1 is a schematic block diagram of an electrical power system with electronic on-off control of the power switch according to the prior art.
Figure 2:
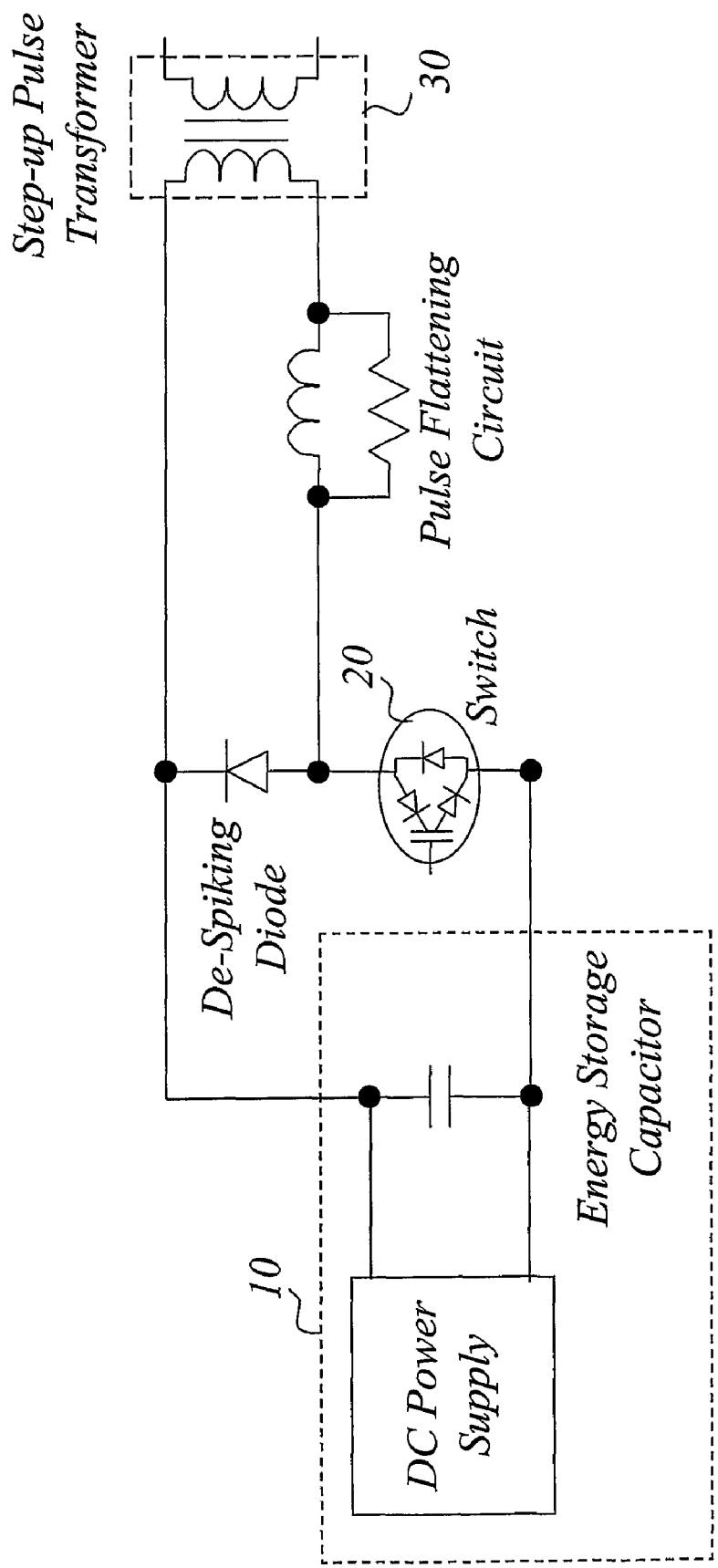
FIG. 2 is a schematic circuit diagram of an exemplary LCW type modulator according to the prior art.

Throughout the drawings, the same reference characters will be used for corresponding or similar elements.

It may be useful to start with a brief analysis of the basic underlying problem. As mentioned in the background section, the LCW type power modulator offers a number of advantages compared to PFN-based power modulator systems. However, there is a price for these advantages. The simple and direct connection between a charged capacitor and the load exposes the switch of a LCW-type modulator to possibly destructive currents and voltages in case the load becomes a short-circuit. This does occur, e.g. in many microwave modulator systems, as the load (e.g. a klystron or magnetron vacuum tube) can and does spark over during the pulse at unpredictable times. The inventors have recognized that in the event of a load short-circuit the only recourse is to turn off the switch(es) as rapidly as possible. But solid-state switches have a non-zero turn-off delay time. For an IGBT switch, for example, the time between driving down the IGBT gate voltage and the response of the IGBT to begin turning off the current typically ranges between 0.1 and 2 microseconds, and if the modulator must produce sub-microsecond pulse rise times, its internal inductance will be low enough so that the load (and switch) current can rise to many times the normal pulse current during this delay time.

When the switch finally interrupts this large current, the internal inductance of the circuit resists this change, causing a spike in voltage to appear across the switch. This is a double threat—if the high current does not damage the switch, the voltage spike may do so.

Figures 3, 4:
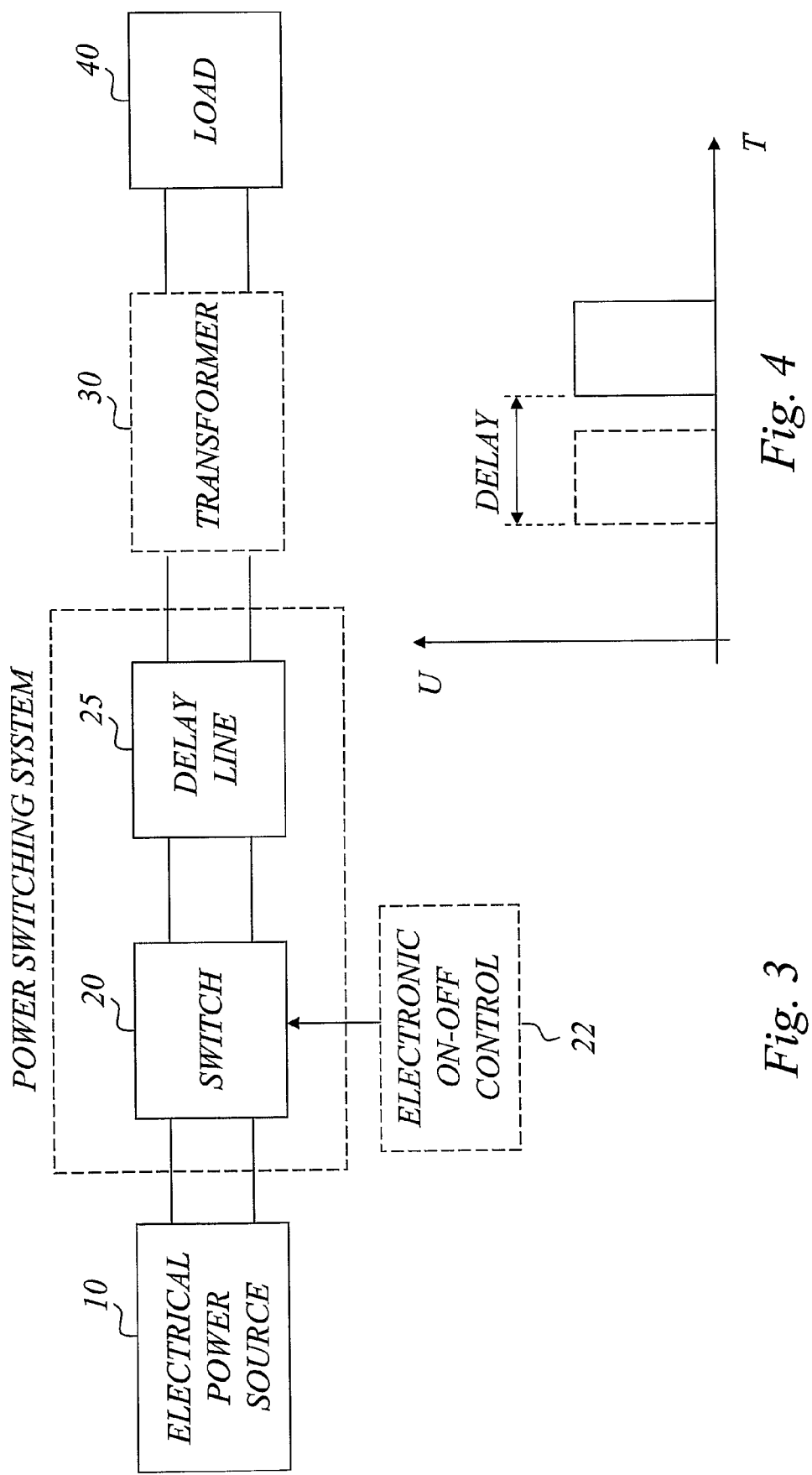
FIG. 3 is a schematic block diagram illustrating a power system according to an exemplary embodiment.
FIG. 4 is a schematic signal diagram illustrating a relatively long time delay on a pulse.

A transmission delay line is introduced between the switch and the power output side of the power switching system so that the switch is shielded from a load fault over-current by the time delay of the transmission line, as illustrated in FIG. 3. The power system of FIG. 3 is similar to that of FIG. 1, except for the delay line 25 that is properly configured between the switch 20 and the (optional) transformer 30 or the actual load 40. Basically, the power switching system of FIG. 3 comprises a power input side connected to the power source 10 and a power output side connected to the transformer 30 (if a transformer is used) or the load 40. From the power switching side, the (optional) transformer may be regarded as part of the load; this is merely a question of logical definition. The power switching system further has a switch 20 for switching an energy pulse from the power input side to the power output side, and a transmission line 25, connected between the switch and the power output side, for transmitting the energy pulse with a delay to enable protection of the switch from a possible load fault current. This switch protection principle is generally applicable to all power-switching systems, but particularly useful for on-off controllable switches, such as IGBTs, MCTs, GTOs, ICTs, MosFet as well as other modern solid-state switches, that are used together with appropriate trigger or control circuitry 22.

In this way, the power switch 20 would never have to interrupt a current above its ratings, and the "back-spike" voltage at turn-off would also be greatly reduced. This would give us the ability to withstand repetitive load sparks, for example as in a magnetron modulator.

The transmission line may for example be configured with a delay that is long enough so that the switch has already been turned off in normal pulse operation before the load fault current reaches the switch, as illustrated in FIG. 4. The pulse indicated by dashed lines is the pulse as seen by the switch and the pulse indicated in solid lines is the delayed pulse as seen by the load at the power output side.

The technology described herein hence provides a time delay shielding of the switch from the over-current resulting from a load short circuit. With the circuit according to the present invention, the switch is capable of performing work up to its full ratings of voltage and current, so it is used most efficiently. With a PFN-based circuit, the switch delivers only half of the operating (charging) voltage to the load, and because it is exposed to the consequences of a load short-circuit it must be operated at only half the rated current, since the switch current will double if the load is short-circuited. In conclusion, a power system using the protection principle of the invention can surprisingly deliver four (4!) times the power compared to a corresponding conventional power system without the delay-based switch protection. In this respect, the transmission line according to the invention is preferably substantially voltage-transparent, although some voltage modulation may be integrated into the transmission line to compensate for a voltage-droop of a capacitor-based power source, as will be explained later on.

Figures 5, 6:
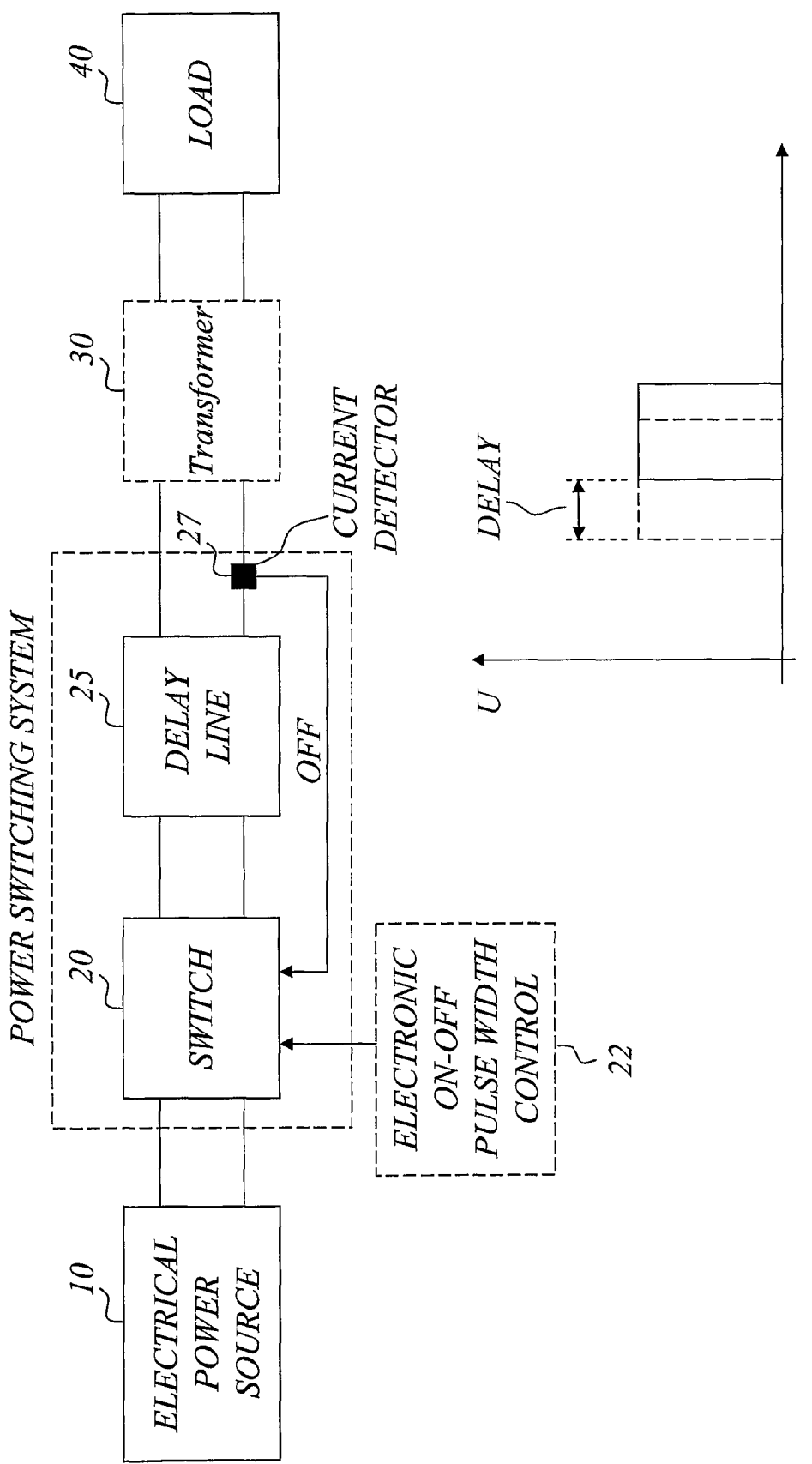
FIG. 5 is a schematic block diagram illustrating a power system with active current detection and turn-off according to an exemplary embodiment.
FIG. 6 is a schematic signal diagram illustrating a time delay that is relatively shorter than the delay of FIG. 4.

In an example embodiment, which is schematically illustrated in FIG. 5, the power-switching system is also provided with a current detector 27, which detects a fault current and triggers a turn-off signal to the switch if an over-current is detected. In this way, it is also possible to actively detect a load fault current and actively turn the switch off before it actually knows that there has been a load fault. The switch will thus be turned off (opened) under normal current flow and will not be subject to destructive over-current or over-voltage conditions. There may be other ways of protecting the switch in response to a detected fault current, including turning off (opening) an additional switch that normally is always closed during normal operation.

The current detector 27 is preferably installed at the output of the delay line. Any suitable current detector known from the prior art may be used, e.g. a current detector based on a simple coil and shunt resistor. The current detector is preferably associated with a simple comparator circuit (not shown) that operates on the output signal of the detector. The comparator may be configured so it trips when the output signal exceeds some value higher than the normal current, say 1.5 times the normal current. Then if the load becomes faulted, the current doubles and this trips the comparator. By way of example, if an IGBT switch is used, the output voltage from the comparator may then be used to turn on a Mosfet located at the IGBT gate and remove the gate voltage from the IGBT. The operation may be latched so it requires a reset signal to restart pulses, or at least stretch the turn-off signal so it is active longer than the fault transients are running around in the delay line and so it keeps the IGBT in the off state for this interval before allowing another gate pulse to occur. The whole system may be floating, but if the system is grounded, the current detector should preferably be arranged at the hot line.

Using a current detector and actively turning the switch off also means that the required delay can be minimized, compared to the basic embodiment of FIG. 3. This means that a more compact construction can be achieved since the physical size of the transmission line can also be minimized, which naturally is a great advantage. In this respect, it is important to consider how much delay is needed. Normally, the delay must be larger than the turn-off delay of the switch, unless very short pulses are produced (if the turn-off delay is a couple of microseconds and sub-microsecond pulses are produced it is sufficient for the delay to be larger than the sub-microsecond pulse width). As an optional security measure, just to be on the safe side, the delay of the transmission line is typically larger than sum of the switch turn-off delay and the current fall-time so that the current can be fully "off" before the news of the fault reaches the switch. To avoid interfering with the pulse shape, the transmission line preferably has a delay larger than half the pulse width. In this way, reflections caused by the transmission line will never occur during the pulse.

By way of example, consider an IGBT switch with a turn-off delay time of say 2 microseconds (the time between driving down the IGBT gate voltage and the response of the IGBT to begin turning off the current), and the current fall-time after the delay is say 0.5 microseconds, then it may be desirable to provide at least 2 microseconds, or preferably at least 2.5 microseconds of delay time so the current can be fully "off" before the news of the fault reaches the IGBT. If this is done, the voltage "back-spike" should be the same as if the IGBT were running into a normal resistive load. The current being switched off is not larger than normal, and the turn-off voltage is also normal.

Inserting a 2.5 uS delay line between each pulse module and its pulse transformer primary connection in effect "de-couples" the pulse module from the load for 5 uS. In other words, it takes 5 uS or a full round-trip in the delay line before the module "sees" the load. This can simplify tuning of the modulator and make it less sensitive to the load impedance, especially if the delay line length is at least half of the maximum pulse width we want from the modulator. If we want a 10 uS maximum pulse, the delay line should be at least 5 uS in "length" to get this de-coupling effect. If this is done, then the modulator pulse top flatness and overshoot can be "tuned" on the workbench with a dummy load applied to the delay line that represents the pulse transformer's stray inductance and capacitance and reflected load resistance, and we can then be confident that the right pulse shape will be produced on the load before full-power testing and/or operation.

Figure 7:
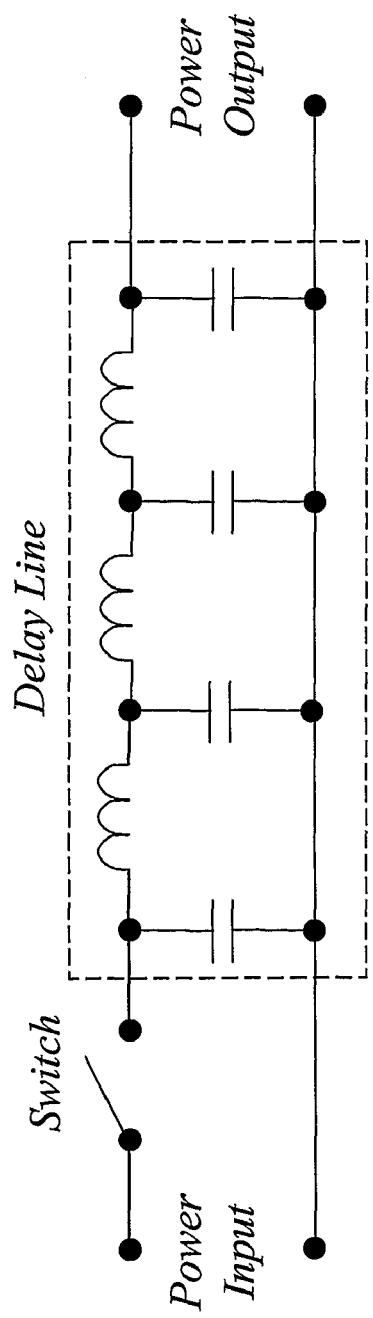
FIG. 7 is a schematic circuit diagram illustrating an exemplary power-switching system based on an LC transmission line according to a first preferred embodiment.

FIG. 7 is a schematic circuit diagram illustrating an exemplary power-switching system based on an LC transmission line according to a first embodiment. Advantageously, the delay line is a passive transmission delay line, such as an inductor-capacitor (LC) based transmission line. The LC-based transmission delay line looks a lot like a traditional PFN network, but has an entirely different function. The transmission line is not used for storing the pulse energy as the PFN, but is merely a delay line to transmit the pulse with more or less the same voltage on the output side as on the input side. The PFN output voltage is merely half the input voltage, and requires a traveling wave to extract the capacitor energy. In this regard, the transmission delay line of the invention is a non-PFN circuit.

In an exemplary implementation, RIFA 0.68 uF 1600 volt capacitors at 1000 amps and 1000 volts, ringing at 400 kHz have been tested and it was determined that these units are surely rugged enough to serve as delay line capacitors. The great advantage of these capacitors is that they are very high quality units, and also quite inexpensive. The space needed for the delay line assemblies may be available inside the pulse transformer tank, where a suitable cooling fluid such as oil can cool the components quite efficiently. There is generally no need to adjust the delay line once the overall power modulator is "tuned" and operating.

Normally, the transmission delay line has two output terminals for connection over the load side for protection against the over-current from a short circuit over the load. Other equivalent configurations will be discussed later on.

The impedance of the transmission line is typically matched to the load with which the power switching system is intended to be used so that the pulse energy goes into the load and does not bounce back to the pulse generating module(s).

Figure 8:
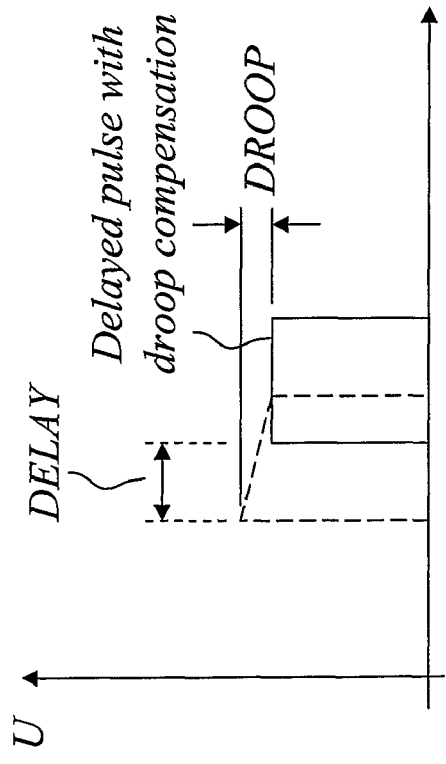
FIG. 8 is a schematic signal diagram illustrating a delayed pulse with voltage-droop compensation.

Although the delay line normally transfers the pulse with more or less the same voltage on the output side as on the input side of the transmission line, the transmission line may in fact be designed as a somewhat non-uniform transmission line to customize the pulse form. For example, the impedance on the output side of the transmission delay line may be different from the impedance on the input side of the transmission delay line to thereby achieve a tapering of the impedance over the delay line. If the impedance on the output side of the transmission delay line is lower than the impedance on the input side of the transmission delay line it is for example possible to compensate for a voltage-droop during discharge of a capacitor-based power source and maintain a pulse flatness better than 1 percent of the mean pulse amplitude, as schematically illustrated in FIG. 8. By way of example, the tapering of the impedance may be achieved by inserting an electrically conducting rod that has a tapered cross-section into the delay line coil.

Figure 9:
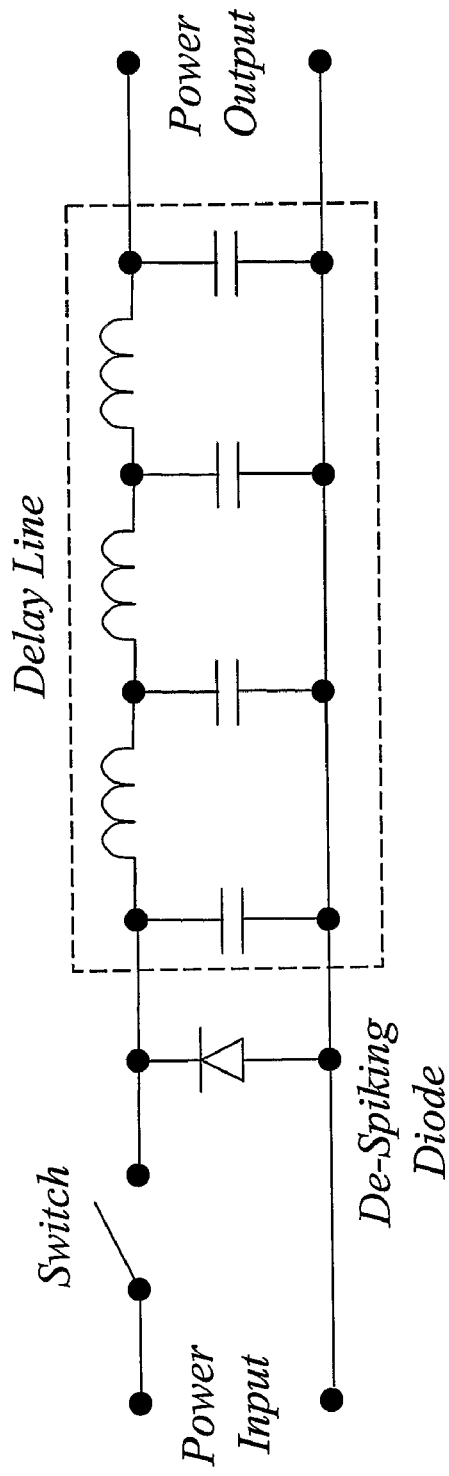
FIG. 9 is a schematic circuit diagram illustrating an exemplary power-switching system based on an LC transmission line according to a second example embodiment.

FIG. 9 is a schematic circuit diagram illustrating an exemplary power-switching system based on an LC transmission line according to a second embodiment. In the power-switching system of FIG. 9, there is provided a de-spiking diode connected, on the input side of the transmission line, in parallel with a capacitor of the inductor-capacitor based transmission line, as an optional security measure. The de-spiking diode is thus arranged at the start of the delay line. This diode can give some advantages. Since the diode is in parallel with a capacitor which is part of the delay line, inverse voltage and current cannot be applied to this diode instantly and it can be allowed to turn on (and off) more slowly than the fast diodes used at the IGBT switch to limit the turn-off voltage spike on the collector. This de-spiking diode can be placed in series with a small resistance (not shown) to damp out any ringing in the delay line that occurs after the pulse, acting as an end-of-line clipper.

Figure 10:
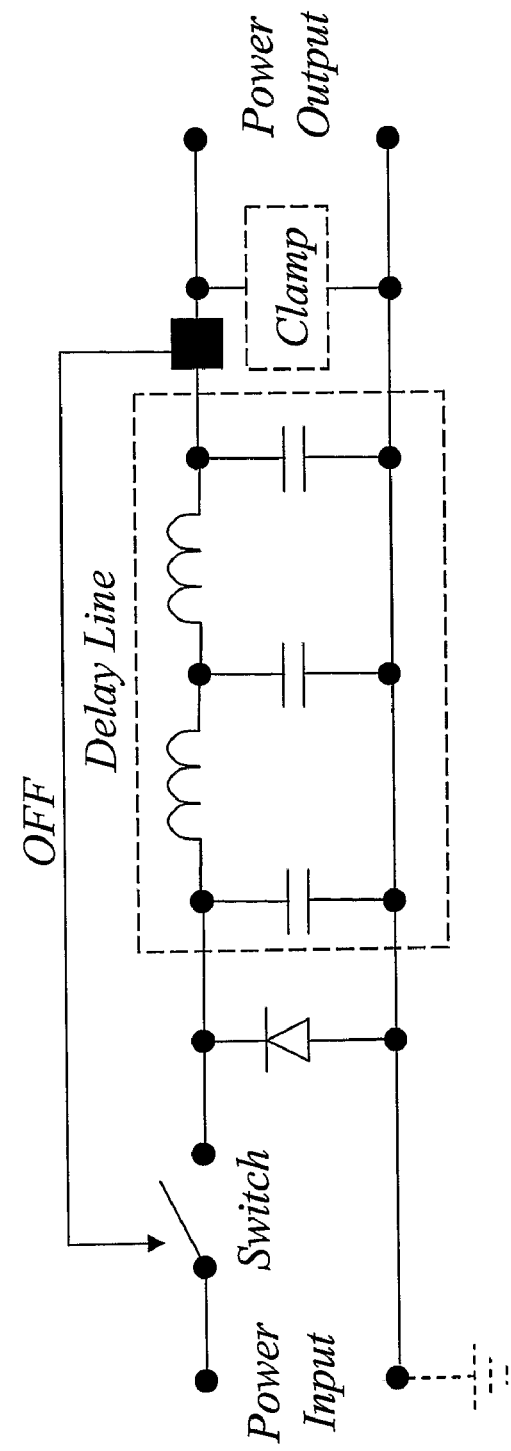
FIG. 10 is a schematic circuit diagram illustrating an exemplary power-switching system based on an LC transmission line according to a third example embodiment.

FIG. 10 is a schematic circuit diagram illustrating an exemplary power-switching system based on an LC transmission line according to a third embodiment. There is not only the problem of short-circuits at the load, but there may also be a problem with an open-circuit load fault. For this reason, the power switching system illustrated in FIG. 10 preferably comprises an optional voltage clamping circuit, such as a metal-oxide varistor, provided in parallel with the delay line on the output side of the transmission line to enable protection against an open-circuit load fault. In this way, if the load is not present, the voltage clamp limits the rise of voltage and prevents a voltage doubling at the output (and input) of the delay line. Some state-of-the-art switches have a built-in diode protection for this purpose, and then a voltage clamp is not required. Also shown in FIG. 10 is the combined current detector and comparator triggering an OFF command signal to the switch if a load fault current is detected. If the system is grounded, the current detector has to be arranged at the hot line side of the overall circuit.

As mentioned above, the power switching system has a transmission line that looks like a traditional PFN network, but actually has an entirely different function and connection in the overall circuit.

In the following, the technology described herein will be described in comparison to a number of prior art documents:

U.S. Pat. No. 3,273,075 relates to a conventional PFN-type modulator that is switched by a large transistor that is connected in series with a saturable reactor. When the transistor is triggered, an RC network is discharged into the primary of a pulse transformer to give a warm-up pulse to a magnetron load and prepare it for the high power pulse from the PFN. There is claimed in this document that this is a good way to prevent the magnetron from turning on in the wrong oscillation mode. According to this document, when the saturable reactor switch closes, the transistor is connected directly to the hot side of a PFN and the ground side of the PFN is connected to the pulse transformer primary. Hence there will be no time delay between the transistor and the pulse transformer load. A load spark from the magnetron would be transmitted immediately to the transistor, causing the transistor current to double instantly.

In the circuit described above, a delay line is inserted between the switch and the pulse transformer primary, so any sparking of the load is hidden from the switch by the delay line's time delay. This for example gives enough time to detect the load spark and turn off the switch before it actually knows that there has been a spark.

In U.S. Pat. No. 3,273,075 the saturable reactor switch closes after the first RC network has had time to prime the magnetron, but once this reactor switch closes and applies the PFN pulse to the magnetron there is no time delay between the load (magnetron) and the transistor switch. Any load short-circuit will cause an immediate rise in transistor switch current, unlike technology described herein.

U.S. Pat. No. 3,737,679 describes a method of using SCR (Thyristor) switches to discharge a PFN into a pulse transformer primary. In SCR switches, the big problem is that they do not handle high values of dI/dt very well, and can be damaged if the turn-on dI/dt is larger than a few hundred amperes per microsecond. Therefore an additional small PFN is added to deliver a pre-pulse current to the SCR, and a saturable-core reactor switch is also added between the SCR and the main PFN to delay the start of the main PFN discharge until the SCR is soaked with current and is ready for the large pulse of the PFN. Once the main PFN pulse starts there is no time delay between the load and the SCR, so any load fault (short-circuit) causes an immediate rise in SCR current. Anyway, the SCR type switch cannot be electronically turned off.

In contrast, the technology described herein provides a time delay between the switch and the load, making it possible to detect the fault and safely turn off the switch before the presence of the load fault is felt by the switch.

U.S. Pat. No. 4,160,214 describes a conventional PFN type modulator, in which the PFN is divided into a number of parallel modules and in which each module is switched by an SCR switch. The pulse transformer is driven by all the PFN modules connected in parallel to the primary side. Triggering the switches thus provides, by the discharge of the elementary PFN cells, a resultant signal made up of elementary pulses of predetermined length. The delay of a PFN cell simply defines the period of time in which energy is extracted from the PFN, and thus determines the pulse length of the respective elementary pulse. The PFN delay is therefore only part of defining the pulse, and not at all related to any delay of the generated pulse itself. The charging system is a conventional resonant charger with a series SCR switch.

Once again, there is no protective time delay between the switches and the load, and a load fault is seen immediately by the switches. Also, the switches in U.S. Pat. No. 4,160,214 are of the SCR type, and cannot be electronically turned off, so the pulse width is fixed by the delays of the modular PFN cells and cannot be changed. It can also be noted that the circuitry in U.S. Pat. No. 4,160,214 does not store the pulse energy in a capacitor, but rather stores the pulse energy in the PFN system. Hence they will not be able to control the pulse width electronically by turning the switches off.

U.S. Pat. No. 4,614,878 discloses a pulse generator based on storing pulse energy, not in a capacitor, but in a PFN structure, which is switched by parallel-connected MosFets. The pulse generator is generally adapted for sub-microseconds pulses, and would be impractically large if one tried to make a 5 or 10 uS pulse with it, as it uses transmission-line type pulse inverter and pulse transformer structures rather than a lumped element-type of pulse transformer. The PFN pulse is fed to an inverting transformer to thereby change it from a negative-going pulse to a positive-going pulse, and after that it is transformed by a coaxial-line type transformer to generate a higher voltage for the load. The problem of switch protection is not mentioned.

In the following a number of exemplary implementations of a delay-line-based power switching sub-system will be described in the particular context of power modulators.

Figure 11:
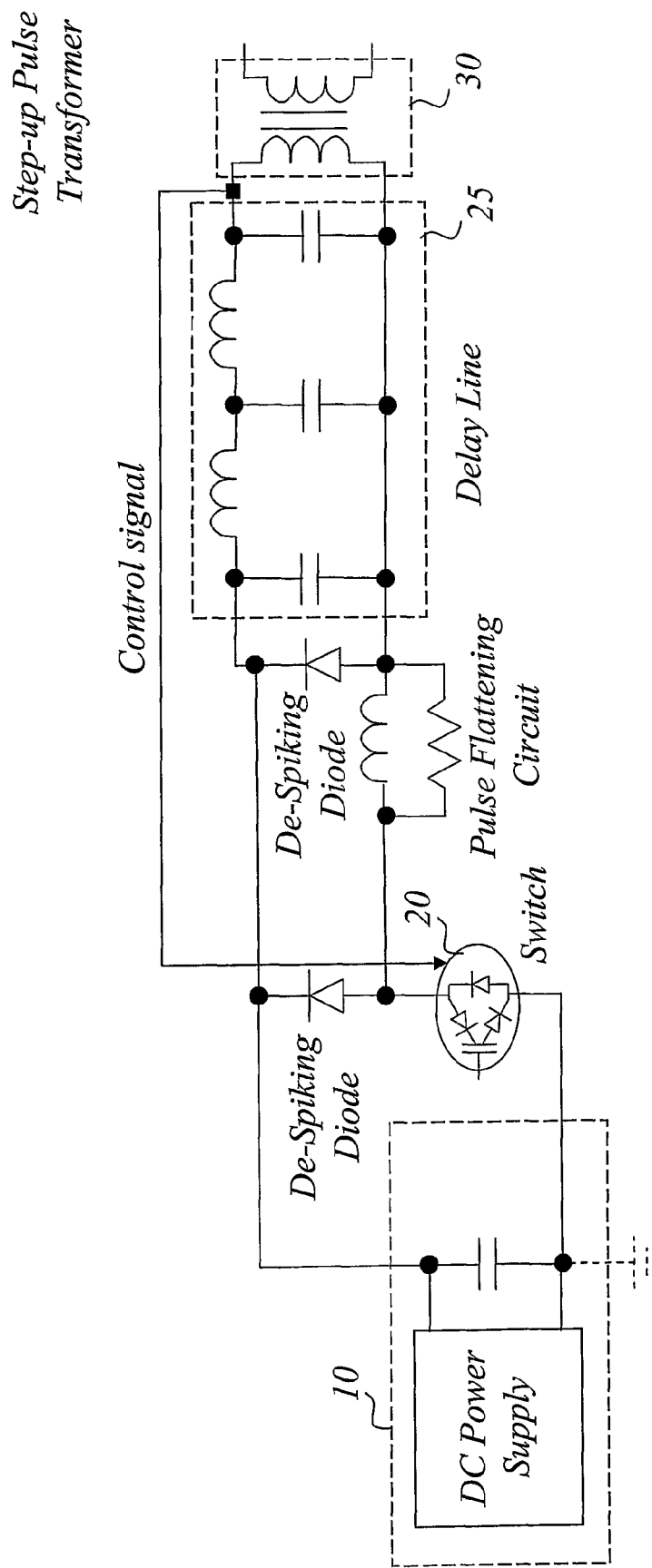
FIG. 11 is a schematic circuit diagram illustrating a power modulator according to an exemplary embodiment.

FIG. 11 is a schematic circuit diagram illustrating a power modulator according to an exemplary embodiment. The electrical power source 10 is based on a conventional DC power supply, which charges an energy storage capacitor. There is a power switch 20, such as an IGBT switch, provided for switching the capacitor energy via a pulse flattening circuit, such as a passive LR network, and a transmission delay line 25 to the step-up pulse transformer 30. In addition to the main IGBT de-spiking diode, there is preferably a de-spiking diode connected, on the input side of the transmission line, in parallel with a capacitor of the inductor-capacitor based transmission line. This will remove some of the stress from the main IGBT de-spiking diode string, as this string will not need to handle all of the residual current flow from the transformer inductance. This diode can for example be a relatively "slow" diode like the HF160 (1600 volt, 75 ampere) stud-mount type of diode. The delay line 25 is preferably configured to have a delay that is larger than the turn-off delay of the power switch 20 to enable detection of a fault current from a short-circuit over the load so that the switch can be turned off before the over-current arrives. To avoid reflections during the pulse, the delay is typically larger than half the pulse width.

In this particular example, an additional flattening circuit is used. However, this function can be built into to delay line which then has a double function: i) to delay the energy pulse for switch protection purposes, and ii) to customize the pulse shape of a pulse with a predetermined pulse length that is given by the on-off trigger signals to the power switch. The customization of the pulse shape by the delay line does hence generally not affect the pulse length, but may be employed, e.g. to compensate for a voltage droop during discharge of the capacitor.

Turning to a specific example, assume that a delay line with 4 uS delay time (for a pulse that is 7.5 uS wide) is built for use with a 12-module modulator. If the intended modulator load is 170 kV at 120 amps, then the load impedance is 1417 Ohms. If the pulse transformer has a turns ratio of 170 kV/1200 V=142 (a split-core half-turn primary with 71 turns on the secondary, for example) then the load as reflected to the primary will look like 1417/(142)^2=0.07 Ohms. Each of the twelve "independent" modules then must drive a load of 0.07×12=0.84 Ohms. The pulse width is 7.5 uS max (FWHM) so an 8 uS delay line round-trip time will fully isolate the modules from the load and make the module tuning independent of operating point. It is important to note that no changes in pulse flattening or "tuning" components will be needed, regardless of the load impedance.

For a more hands-on feeling of the technology described herein, some basic design calculations for an exemplary delay line with 0.84 Ohm impedance and 4 uS length (one-way time) will be outlined.

Some basic formulas for an LC-based transmission line:

$$Z = \sqrt{\frac{L}{C}} \quad (1)$$

$$T = N\sqrt{LC}$$

where L is the inductance per line section, C is the capacitance per section and T is the one-way delay time from end to end of the line (N is the number of LC sections in the line). In addition to these well-known formulas, there is another very useful formula regarding how the rise time of a delay line is related to the delay time:

$$t_r = \frac{T_d}{N^{0.735}}; \quad (2)$$

$$N = \left[\frac{T_d}{t_r}\right]^{1.36}$$

Here, $t_r$ is the usual 10-to-90 percent rise time, $T_d$ the delay time and N the number of sections in the line. This is an important formula (derived from measurements of many actual delay lines) and it should be the first one used in designing a delay line. We want the line to act like a piece of coaxial cable and normally not change the pulse shape or at least not the pulse length, and to have that happen the line's rise time must be faster than the overall modulator rise time, so the line has very little effect on the pulse length. Choosing the line's rise time to be ½ of the modulator rise time is a good start in this direction. Clearly, we can't make the line with zero rise time (like a coax cable) as this requires an infinite number of sections (again, like a very long cable). But if the line has ½ the system rise time, it will only affect the system rise time at the ten percent level, since it is well known that if a pulse with a given rise time (t) is sent through a transmission system (amplifier, transformer or delay line) which has rise time $t_r$, the output pulse has a rise time given by:

$$t_{out} = \sqrt{t^2 + t_r^2} \quad (3)$$

So if the line has half the rise time of the pulse, the output pulse has a rise time that is 1.11 times the input pulse rise time. If we want an output rise time of 0.75 uS, then the input (module) rise time must be 0.68 uS (or less). This is reasonable based on the measured performance of practical modulators. So we ask for a delay line rise time of half this, or 0.34 uS. We want a delay of 4 uS, so formula (2) leads to the conclusion that 29 sections are needed in this delay line.

The two equations in (1) combine to give:

$$ZT = NL \quad (4)$$

Assuming Z (0.84 Ohms), T (4 uS) and N (29) thus gives the inductance per section as L=0.116 uH, which leads to C=0.164 uF.

The nearest standard RIFA capacitor value we can get is 0.15 uF (1600V), so we use this value. The inductance per section becomes 0.138 uH. With a 29-section line, the total inductance is 29×0.116=3.36 uH.

As an example, we can make the delay line as a Guillemin E-type, the "standard" configuration for almost all radar PFNs since World War II. This is a straight-line single coil (a helix) with taps and with capacitors laid out in a straight line as well. The inductance in microhenries of a long straight helix is given closely by:

$$L = \frac{n^2 r^2}{9r + 10l} \quad (5)$$

Figure 15:
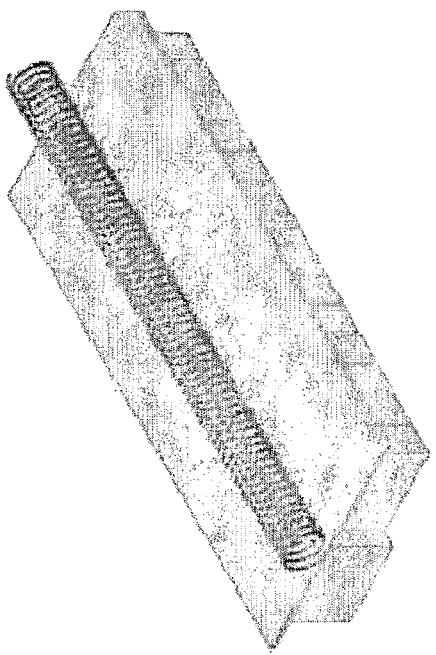
FIG. 15 is a schematic diagram illustrating an exemplary implementation of a delay line assembly.

Here, n is the number of turns in the helix, r is the mean radius of the helix in inches, and $l$ is the total helix length in inches. The capacitors will be arranged in a double line, one line containing 14 and the other with 15 capacitors, to trade length of delay module for width and attempt to optimize its volume. The capacitors (e.g. RIFA 150 nF@1600V, type PHE 450) will each fit inside a box that is 0.5 inches thick, 1.25 inches wide and 7/8 inch tall. So the longer of the two lines of capacitors will be 0.5×15=7.5 inches long. The coil "taps" will be spaced 1/4 inch apart, as the two lines of capacitors will be staggered by 1/4 inch with respect to each other. FIG. 15 is a schematic diagram of an exemplary assembly. Allowing the end sections of the helix to be each 1/4 inch long, the overall length of the helix coil will be 8 inches.

By trying some numbers in Eq. (5), a mean helix radius of 0.275 inches gives 60.5 turns. Call it 60 turns for ease of calculation. This is a coil wound with 0.050 inch diameter wire on a 0.5 inch diameter rod as a winding mandrel. With N capacitors, there are N−1 center sections (sections that are between two capacitors) of this coil, plus two end sections. The coil is then divided into N+1 equal pieces. So if N=29, the coil divides into 30 pieces, each with about 2 turns.

Figure 12:
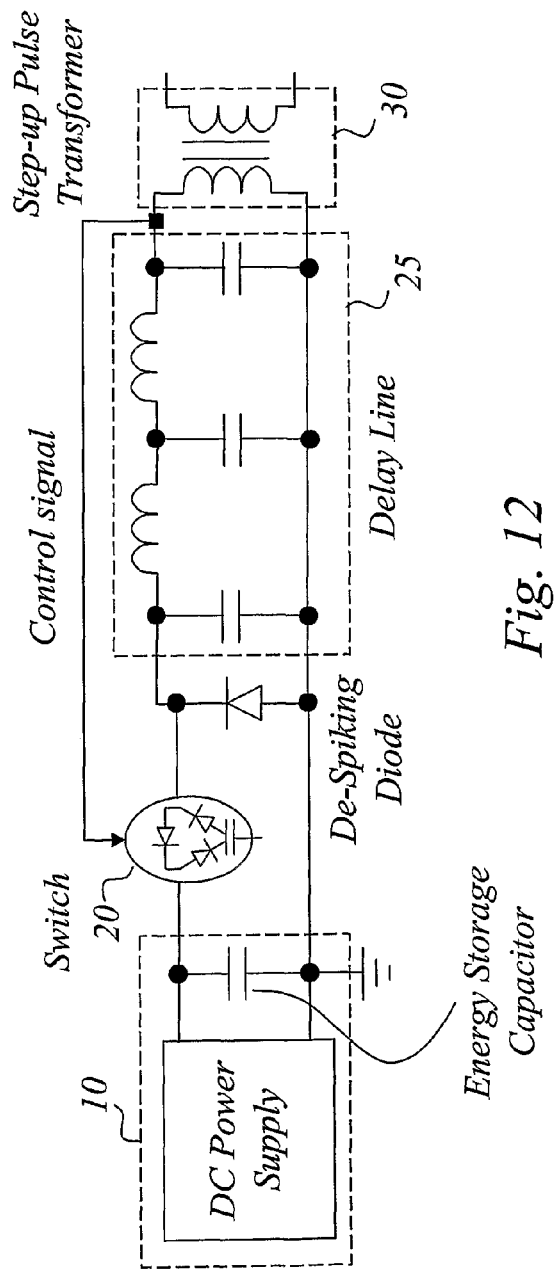
FIG. 12 is a schematic circuit diagram illustrating a power modulator according to another exemplary embodiment.

FIG. 12 is a schematic circuit diagram illustrating a power modulator according to another exemplary embodiment. In this example, the separate pulse flattening circuit shown in FIG. 11 is eliminated, and instead the flattening function is integrated into the delay line 25. For this purpose, the delay line may be configured with an impedance on the output side of the transmission delay line that is lower than the impedance on the input side of the transmission delay line to compensate for a voltage-droop during discharge of the energy storage capacitor. This tapering of the impedance may be achieved by inserting a conducting rod having a tapered cross-section into the delay line coil. In this example, the modulator only has a single de-spiking diode.

Figure 13:
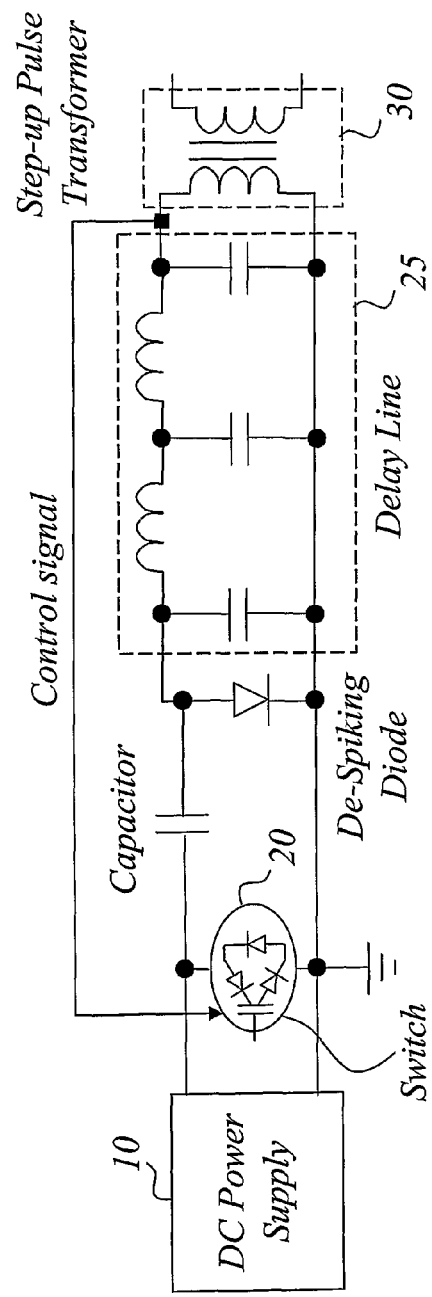
FIG. 13 is a schematic circuit diagram illustrating a power modulator according to an exemplary embodiment.

FIG. 13 is a schematic circuit diagram illustrating a power modulator according to an exemplary embodiment. Compared to the power modulator of FIG. 12, the switch and the capacitor have exchanged places in the circuit topology. This is currently the most preferred embodiment of the invention.

Figure 14:
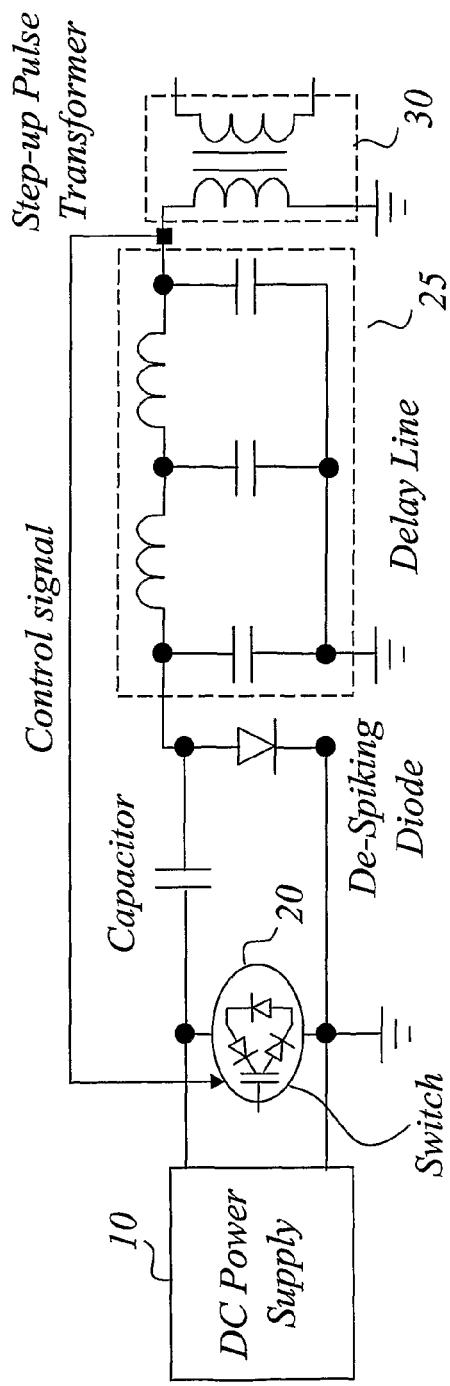
FIG. 14 is a schematic circuit diagram illustrating a power modulator according to another exemplary embodiment.

FIG. 14 is a schematic circuit diagram illustrating a power modulator according to another exemplary embodiment. This is an equivalent circuit compared to that of FIG. 13. Instead of having two output terminals from the delay line that are connected over the pulse transformer as in FIG. 13, the transformer is directly connected to ground, and the hot terminal of the delay line is connected to the hot terminal of the pulse transformer. The delay line is also connected to earth.

The technology described herein is also applicable to power modulators and power systems with multiple switch-based pulse generating modules connected to a pulse transformer, using one or more transmission delay lines for protecting the switches. For example, the transformer may for example be a split-core transformer in a circuit configuration corresponding to U.S. Pat. No. 5,905,646, also published as International PCT Application PCT/SE97/02139 with International Publication Number WO 98/28845 A1, e.g. using several independent pulse generating modules, the energy storage capacitors of which are electrically separated, to ensure equal current flow in the primary windings and the pulse switches, or in a circuit configuration according to U.S. Pat. No. 6,741,484, also published as International PCT Application PCT/SE02/02398 with International Publication Number WO 03/061125 A1, using several pulse generating modules, each of which drives all the magnetic cores. It is for example possible to provide a delay circuit between each pulse switch and the primary connection point to be able to detect a load short-circuit and turn the respective switch off before the over-currents destroys it.

In fact, the fault protection technology described herein is applicable to all switches that have a non-zero turn-off delay time, not just solid-state switches such as IGBTs. It is also applicable to all applications of solid-state switches in any power-switching use, including locomotive traction, automobiles, conveyor systems, escalators and elevators, air conditioning equipment, appliances, not just power modulators. As such, it is a far-reaching and very widely useful concept.

The embodiments described above are merely given as examples, and it should be understood that the claims are is not limited thereto. Further modifications, changes and improvements which retain the basic underlying principles disclosed and claimed herein are within the scope of the invention.

The invention claimed is:

1. An electrical power switching system comprising:
   power input and power output;
   a switch for switching an energy pulse from the power input side to the power output side, wherein said switch is electronically controllable at turn-on and turn-off for switching said energy pulse; and
   a transmission line, connected between the switch and the power output side, for transmitting said energy pulse with a delay such that the switch will be turned off before a load fault current reaches the switch, thus enabling protection of the switch from a load fault current, wherein said transmission line is configured with a delay larger than the turn-off delay of the switch,
   wherein the delay is larger than sum of the switch turn-off delay and the current fall-time of the load fault current.

2. The electrical power switching system of claim 1, further comprising:
   a detector for detecting said load fault current; and
   means for protecting the switch in response to a detected load fault current.

3. The electrical power switching system of claim 2, wherein said means for protecting the switch is operable for turning the switch off in response to a detected load fault current.

4. The electrical power switching system of claim 1, wherein said delay is larger than half the pulse width of said energy pulse.

5. The electrical power switching system of claim 1, further comprising means for electronically controlling said switch to turn-on to start said energy pulse and to turn-off to terminate said energy pulse.

6. The electrical power switching system of claim 1, wherein said switch is a solid-state switch.

7. The electrical power switching system of claim 1, wherein the transmission line is an inductor-capacitor (LC) based transmission line.

8. The electrical power switching system of claim 7, further comprising a de-spiking diode connected, on the input side of the transmission line, in parallel with a capacitor of the inductor-capacitor based transmission line.

9. The electrical power switching system of claim 1, wherein the impedance of said transmission line is matched to the load with which the electrical power switching system is intended to be used.

10. The electrical power switching system of claim 1, further comprising a voltage clamping circuit provided on the output side of said transmission line to enable protection for an open-circuit load fault.

11. The electrical power switching system of claim 1, wherein said transmission line has two output terminals for connection over a load side.

12. The electrical power switching system of claim 11, wherein one of the output terminals is connected to earth and the other output terminal is for connection to a hot terminal on said load side.

13. An electrical power switching system comprising:
power input and power output;
a switch for switching an energy pulse from the power input side to the power output side; and
a transmission line, connected between the switch and the power output side, for transmitting said energy pulse with a delay to enable protection of the switch from a load fault current,
wherein said transmission line is a Guillemin E-type inductor-capacitor (LC) network.

14. An electrical power switching system comprising:
power input and power output;
a switch for switching an energy pulse from the power input side to the power output side, wherein said switch is electronically controllable at turn-on and turn-off for switching said energy pulse; and
a transmission line, connected between the switch and the power output side, for transmitting said energy pulse with a delay such that the switch will be turned off before a load fault current reaches the switch, thus enabling protection of the switch from a load fault current,
wherein said transmission line is configured with a delay larger than the turn-off delay of the switch,
wherein said transmission line is a non-uniform transmission line to customize the pulse form of said energy pulse, and
wherein the impedance on the output side of the transmission line is different than the impedance on the input side of the transmission line to thereby achieve a tapering of the impedance over the transmission line.

15. The electrical power switching system of claim 14, wherein the power input side is connectable to an energy storage capacitor charged by a power supply, and wherein the impedance on the output side of the transmission line is lower than the impedance on the input side of the transmission line to compensate for a droop of the voltage of said energy storage capacitor during discharge of said energy-storage capacitor.

16. The electrical power switching system of claim 14, wherein said tapering is achieved by inserting a conducting rod into a transmission line coil, said conducting rod having a tapered cross-section.

17. An electrical power system comprising:
a power source;
a switch for switching an energy pulse from the power source to a power output side, wherein said switch is electronically controllable at turn-on and turn-off for switching said energy pulse; and
a transmission line, connected in the between the switch and the power output side, for transmitting said energy pulse with a delay such that the switch will be turned off before a load fault current reaches the switch, thus enabling protection of the switch from a load fault current, wherein said transmission line is configured with a delay larger than the turn-off delay of the switch,
wherein the delay is larger than sum of the switch turn-off delay and the current fall-time of the load fault current.

18. The electrical power system of claim 17, further comprising:
a detector for detecting said load fault current; and
means for protecting the switch in response to a detected load fault current.

19. The electrical power system of claim 18, wherein said means for protecting the switch is operable for turning the switch off in response to a detected load fault current.

20. The electrical power system of claim 17, wherein said delay is larger than half the pulse width of said energy pulse.

21. The electrical power system of claim 17, further comprising means for electronically controlling said switch to turn-on to start said energy pulse and to turn-off to terminate said energy pulse.

22. The electrical power system of claim 17, wherein said switch is a solid-state switch.

23. The electrical power system of claim 17, wherein the transmission line is an inductor-capacitor (LC) based transmission line.

24. The electrical power system of claim 23, wherein said transmission line is a Guillemin E-type LC network.

25. The electrical power system of claim 23, further comprising a de-spiking diode connected, on the input side of the transmission line, in parallel with a capacitor of the inductor-capacitor based transmission line.

26. The electrical power system of claim 17, wherein said transmission line is a non-uniform transmission line to customize the pulse form of said energy pulse.

27. The electrical power system of claim 17, wherein the impedance of said transmission line is matched to a load.

28. The electrical power system of claim 17, further comprising a voltage clamping circuit provided on the output side of said transmission line to enable protection for an open-circuit load fault.

29. The electrical power system of claim 17, wherein said transmission line has two output terminals for connection over a load side.

30. The electrical power system of claim 29, wherein one of the output terminals is connected to earth and the other output terminal is for connection to a hot terminal of a pulse transformer.

31. The electrical power system of claim 17, further comprising a voltage step-up transformer provided between said transmission line and a load side.

32. The electrical power system of claim 31, wherein said transformer is a split-core transformer.

33. The electrical power system of claim 17, wherein said electrical power system is a power modulator for generating pulsed output power.

34. An electrical power system comprising:
a power source;
a switch for switching an energy pulse from the power source to a power output side, wherein said switch is electronically controllable at turn-on and turn-off for switching said energy pulse; and
a transmission line, connected in the between the switch and the power output side, for transmitting said energy pulse with a delay such that the switch will be turned off before a load fault current reaches the switch, thus enabling protection of the switch from a load fault current, wherein said transmission line is configured with a delay larger than the turn-off delay of the switch, wherein the impedance on the output side of the transmission line is different than the impedance on the input side of the transmission line to thereby achieve a tapering of the impedance over the transmission line, wherein said power source is a capacitor-based power source including an energy storage capacitor charged by a power supply, and the impedance on the output side of the transmission line is lower than the impedance on the input side of the transmission line to compensate for a droop of the voltage of said energy storage capacitor during discharge of said energy-storage capacitor.

35. The electrical power system of claim 34, wherein said tapering is achieved by inserting a conducting rod into a transmission line coil, said conducting rod having a tapered cross-section.

* * * * *